(12) United States Patent
Schmidt et al.

(10) Patent No.: US 7,504,011 B2
(45) Date of Patent: *Mar. 17, 2009

(54) SPUTTERING TARGET AND METHOD/APPARATUS FOR COOLING THE TARGET

(75) Inventors: Armin Schmidt, Zeulenroda (DE); Gerald Janicke, Bobbau (DE); Roland Weidl, Bollberg (DE); Hendryk Richert, Jena (DE); Bernd E. Gruenler, Zeulenroda (DE); Hans-Jurgen Tiller, Jena (DE); Uwe Kriltz, Jena (DE)

(73) Assignee: Guardian Industries Corp., Auburn Hills, MI (US)

( * ) Notice: Subject to any disclaimer, the term of this patent is extended or adjusted under 35 U.S.C. 154(b) by 528 days.

This patent is subject to a terminal disclaimer.

(21) Appl. No.: 11/256,196

(22) Filed: Oct. 24, 2005

(65) Prior Publication Data

US 2007/0089985 A1   Apr. 26, 2007

(51) Int. Cl.
*C23C 14/35* (2006.01)

(52) U.S. Cl. ............... 204/298.09; 204/298.21; 204/298.22

(58) Field of Classification Search ........... 204/298.09, 204/298.21, 298.22

See application file for complete search history.

(56) References Cited

U.S. PATENT DOCUMENTS

| | | | |
|---|---|---|---|
| 5,262,032 A | 11/1993 | Hartig et al. | |
| 5,284,564 A | 2/1994 | Maass | |
| 5,317,006 A | 5/1994 | Kumar | |
| 5,403,458 A | 4/1995 | Hartig | |
| 5,527,439 A | 6/1996 | Sieck et al. | |
| 5,591,314 A | 1/1997 | Morgan et al. | |
| 7,014,741 B2 | 3/2006 | Rietzel et al. | |
| 2004/0129561 A1 | 7/2004 | Barrett et al. | |

OTHER PUBLICATIONS

Bekaert VDS—Flextrak Magnet Bar: Features, http://www.bekaert.com/bac/products, Jun. 23, 2005.
Gencoa Magnetron Sputtering Cathodes: Technology, http://www.gencoa.com/tech/whatsputtering.html, Jun. 23, 2005.
Angstrom Sciences, Inc.: Overview of Sputtering, http://www.angstromsciences.com/technology/sputtering.html, Jun. 23, 2005.
Richert et al., U.S. Appl. No. 11/256,200, filed Oct. 24, 2005, pending.
Richert et al., U.S. Appl. No. 11/256,195, filed Oct. 24, 2005, pending.

*Primary Examiner*—Rodney G McDonald
(74) *Attorney, Agent, or Firm*—Nixon & Vanderhye, P.C.

(57) ABSTRACT

A sputtering target comprising an outer target tube, an inner support tube supporting a magnet carrier extending along substantially the entire length of the inner support tube; and a water cooling circuit including at least one passageway within the inner support tube with an inlet at one end thereof adapted to receive cooling water from an external source, at least one outlet aperture at an opposite end thereof opening to a cooling chamber radially between the inner support tube and the outer target tube; and a plurality of spiral vane segments attached to an outer surface of the inner support tube.

18 Claims, 4 Drawing Sheets

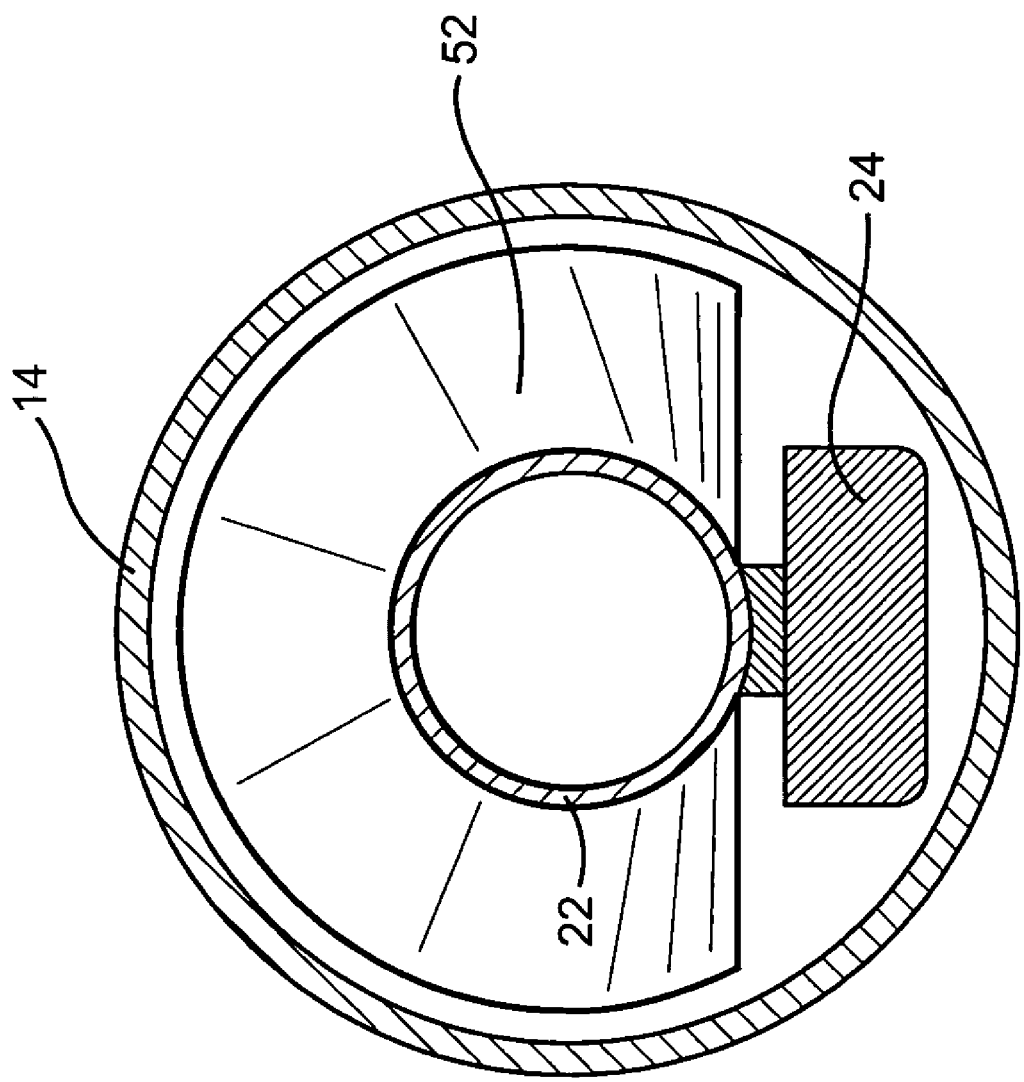

SPUTTERING TARGET AND METHOD/APPARATUS FOR COOLING THE TARGET

This invention relates to a sputtering target and, more specifically, to an internal magnet support tube configuration with cooling enhancement features.

BACKGROUND OF THE INVENTION

The use of sputtering in order to deposit coatings on substrates is known in the art. For example, and without limitation, see U.S. Pat. Nos. 5,403,458; 5,317,006; 5,527,439; 5,591,314; 5,262,032; and 5,284,564. Briefly, sputter coating is an electric-discharge-type process which is conducted in a vacuum chamber in the presence of at least one gas. Typically, a sputtering apparatus includes a vacuum chamber, a power source, an anode, and one or more cathode targets which include material used to create a coating on an adjacent substrate. The target may include an outer tube enclosing a magnet bar assembly including an associated inner magnet bar support tube. More specifically, in certain known arrangements, the one or more magnet bars are secured to the underside of the support tube along substantially the length of the support tube.

When an electrical potential is applied to the cathode target, the gas forms a plasma which bombards the target causing particles of the material from the target to leave the exterior surface of the outer target tube. These particles fall onto the substrate to thereby form the coating thereon. The outer target tube typically rotates about the stationary magnets supported by the inner support tube so that particles are "sputtered" uniformly from the entire periphery of the target tube as it rotates past the fixed magnet bar.

BRIEF DESCRIPTION OF THE INVENTION

It has been found that non-uniform sputtering, i.e., non-uniform eroding of the target surface, is caused at least in part by non-uniform cooling of the interior surface of the outer target tube. Specifically, in a typical target water-cooling arrangement, cooling water flows through the inner magnet bar support tube and reverses direction to flow between the inner support tube and outer target tubes, it has been discovered that air bubbles and "dead water" zones are likely to form at or near the inner tube outlet jets where the cooling water reverses direction (sometimes referred to herein as the "flow-reversal zone"). It has also been discovered that insufficient circulation of cooling water along the inner magnet support bar (i.e., in the radial space or region between the magnet bar and target tube), further degrades the cooling of the target tube in this area. Resulting localized hot spots on the target tube surface can lead to non-uniform sputtering and decreased target component life.

In accordance with an exemplary embodiment of this invention, mechanical flow enhancement devices are attached to the external surface of the inner magnet bar support tube to promote and enhance cooling of the target tube. More specifically, two enhancement devices are provided that may be used alone or in combination to enhance cooling flow and thus promote more uniform sputtering.

The first device is a baffle in the form of a flat plate with an array of apertures formed therein. The baffle is secured to the exterior of the inner magnet bar support tube by any suitable fastening bracket adjacent that end of the inner support tube where the cooling water exits into the space between the inner and outer tubes. In this regard, the cooling water exits the inner tube in the form of a plurality of jets and almost immediately reverses direction to flow between the inner support tube and the outer target tube. By forcing the water to flow through the baffle, sufficient turbulence is created to avoid or at least reduce the creation of air bubbles and/or dead water zones at or near the cooling water flow-reversal zone.

The second device is a flow member in the form of spiral vane segments that are attached to the inner support tube and extend substantially the entire distance between the baffle and the opposite end of the inner and outer tubes. The series of discontinuous vane segments provide an axially extending space on the underside of the inner support tube to accommodate the axially extending magnet bar. The spiral vane segments cause the cooling water that otherwise might stagnate under the magnet bars to continuously circulate into and out of this region to thereby more uniformly cool the target or outer tube, and thus enhance sputter coating uniformity.

Accordingly, in one aspect, the invention relates to a sputtering target comprising an outer target tube, an inner support tube supporting a magnet carrier along substantially the entire length of the inner support tube; and a water cooling circuit including at least one passageway within the inner support tube with an inlet at one end thereof adapted to receive cooling water from an external source, at least one outlet aperture at an opposite end thereof opening to a cooling chamber radially between the inner support tube and the outer target tube; and a plurality of spiral vane segments attached to an outer surface of the inner support tube.

In another aspect, the invention relates to a sputtering target comprising an outer target tube, an inner support tube supporting magnet bar carrier extending along substantially the entire length of the inner support tube; and a water cooling circuit including at least one passageway within the inner support tube with an inlet at one end thereof adapted to receive cooling water from an external source, at least one outlet aperture at an opposite end thereof opening to a cooling plenum radially between the inner support tube and the outer target tube; and a plurality of spiral vane segments attached to an outer surface of the inner support tube; wherein the spiral vane segments are arranged to create a substantially uniform spiral flow path along the length of the inner support bar, and wherein axial spaces between the segments are arranged to accommodate the magnet bar carrier.

In still another aspect, the invention relates to a sputtering target comprising an outer target tube, an inner support tube supporting a magnet carrier extending along substantially the entire length of the inner support tube; and a water cooling circuit including at least one passageway within the inner support tube with an inlet at one end thereof adapted to receive cooling water from an external source, at least one outlet aperture at an opposite end thereof opening to a cooling chamber radially between the inner support tube and the outer target tube; a baffle comprising a substantially flat plate attached to the inner support tube adjacent the opposite end, the plate extending radially within the plenum between the inner support tube and the outer target tube and having an array of flow apertures therein; and a spiral flow enhancement vane attached to an outer surface of the inner support tube.

The invention will now be described in detail, in connection with the drawings identified below.

BRIEF DESCRIPTION OF THE DRAWINGS

FIG. 4 is a section taken along the lines 4-4 in FIG. 3.

DETAILED DESCRIPTION OF THE INVENTION

Figure 1:
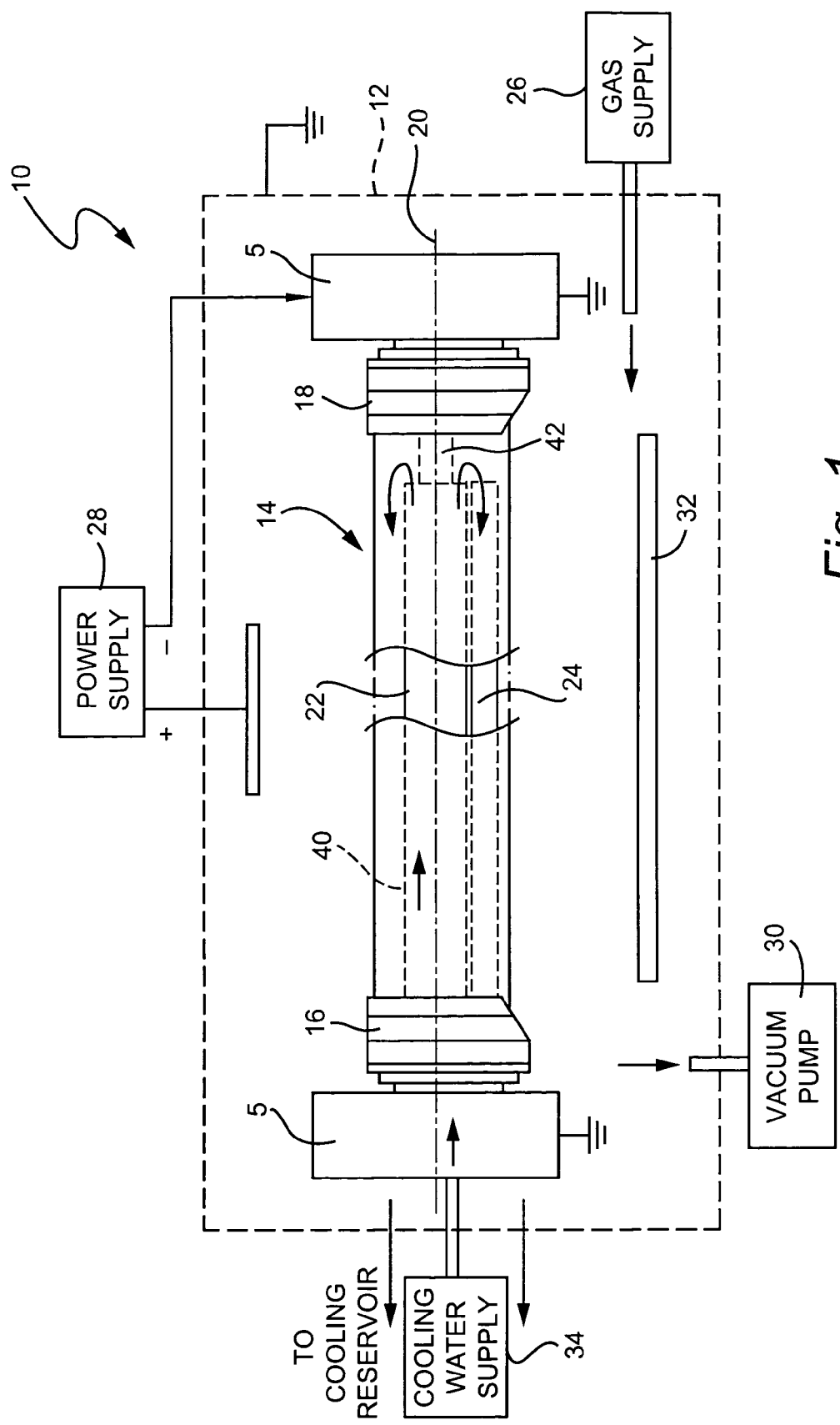
FIG. 1 is a simplified and partially schematic side elevation of a conventional sputtering apparatus.

FIG. 1 illustrates in simplified form a conventional magnetron sputtering apparatus 10. The apparatus includes metal walls 12 of the vacuum chamber in which sputtering is performed; a cylindrical rotating target (or outer target tube) 14 that is supported at opposite ends by a bearing block 16 and a drive block 18 so that the target is rotatable about axis 20; and an inner magnet bar support tube 22 that supports a magnet carrier and associated magnets (represented by the single block 24) that extends along the underside of the inner support tube 22, substantially the entire length of both the inner support tube and the outer target tube. Gas is supplied to the vacuum tube via an external gas supply 26 while power is supplied via external power supply 28. The vacuum tube is evacuated by a vacuum pump 30.

In a typical sputtering process, the plasma formed when an electrical potential is applied to the cathode target bombards the target and the dislodged particles fall on the substrate 32, forming a coating thereon. It is important that throughout the process, the target tube be cooled to a specified temperature. Accordingly, cooling water from a source 34 is introduced into the interior of the hollow inner support tube 22 at one end thereof through the bearing block 16, and exits the opposite end of the tube through a plurality of nozzle or jet apertures 36 provided in an end plate 38 (see FIG. 2). The apertures 36 may be arranged to emit streams parallel to the longitudinal axis of the target tube and/or at an acute angle thereto. The cooling water then reverses direction and flows back along the exterior of the inner tube 22, in the chamber or space 40 radially between the inner support tube 22 and the outer target tube 14, exiting the target tube via the same bearing block 16. Note that while the support tube 22 is terminated short of the drive block 18 to permit the cooling flow to exit the tube and reverse flow through the chamber 40, an inner spindle 42 that may be fixed to the end plate 38, supports the inner tube in the drive block 18. The particular manner in which the inner support tube 22 is mounted vis-à-vis the rotatable target tube 14 is not of particular significance to the invention described herein.

Figure 2:
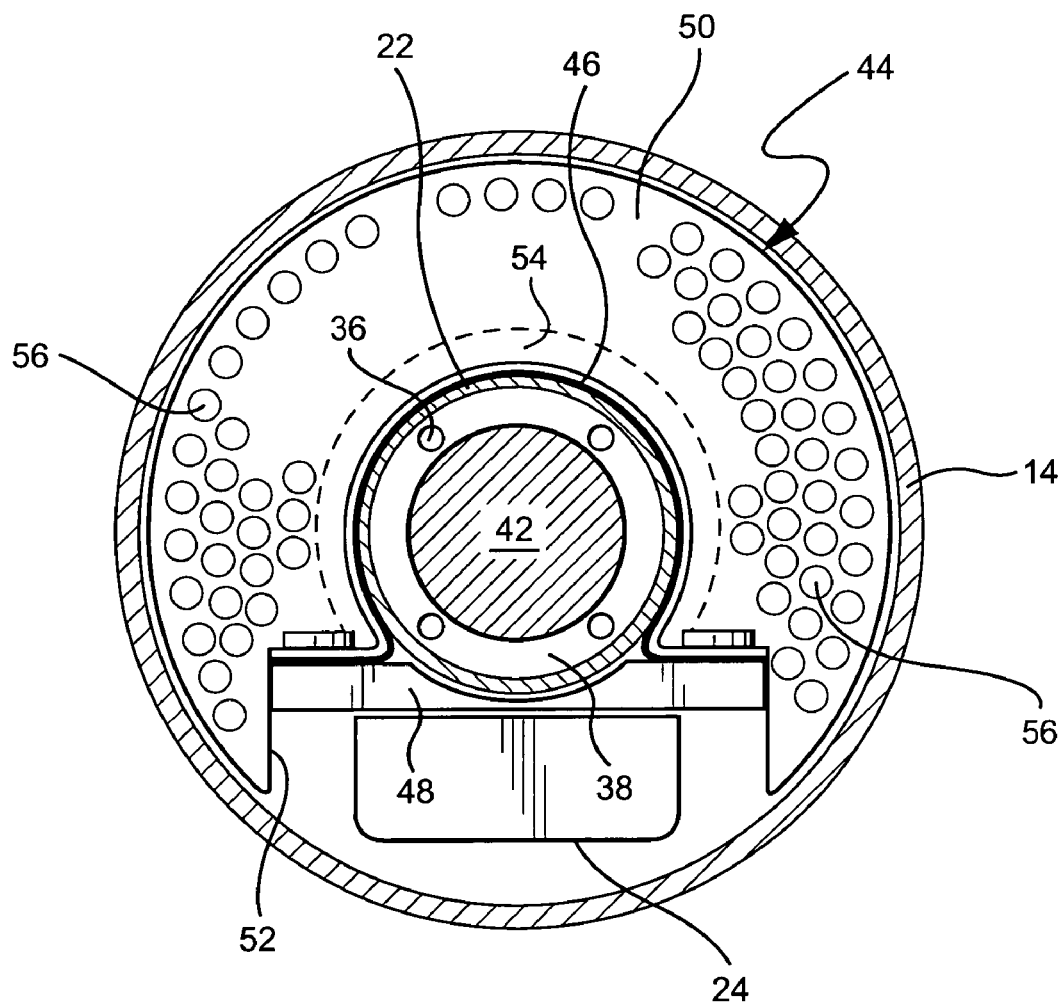
FIG. 2 is an end view of an inner magnet support bar and cooling flow baffle in accordance with an exemplary embodiment of the invention.

This invention relates to devices employed to enhance the cooling of the target tube 14. With reference to FIG. 2, one example of such a device is in the form of a baffle 44 attached by tube clamp-type bracket components 46, 48 and suitable fasteners (or equivalents) to the exterior surface of the inner support tube 22. The baffle 44 is located at the end of the inner support tube 22 where the cooling water exits the inner support tube and is thus adjacent and downstream of the flow-reversal zone.

Baffle 44 in the example disclosed is composed of a flat, generally circular metal plate 50 that is designed to generally surround the inner tube 22, but with a generally rectangular cut-out 52 that accommodates the magnet bar array 24. Note also that the baffle plate is solid about an inner peripheral band portion 54, thus blocking flow at the radially innermost portion of the cooling flow path between the inner and outer tubes. The remaining area of the baffle plate is provided with a dense array of flow apertures 56. The array of apertures extends approximately 270° about the inner tube, from one side of the cut out 52 to the opposite side of the cut-out. Thus, after the streams of water exit the nozzle or jet apertures 36 in the end plate 38, the cooling water reverses direction and flows immediately through the array of apertures 56 in the baffle 44 and into the chamber or space 40. The presence of band portion 54 forces the cooling water to flow radially away from the inner support tube 22, ensuring more cooling flow closer to the target tube 14. The baffle 44 also increases the flow velocity above and below the magnet carrier 24 and creates a significant degree of turbulence adjacent the drive block 18, thereby establishing good mixture of the radially inner and outer flows and eliminating dead water zones at or adjacent the flow-reversal zone. At the same time, rotation of the target tube 14 reduces bubble adhesion on the inner support tube wall.

Figure 3:
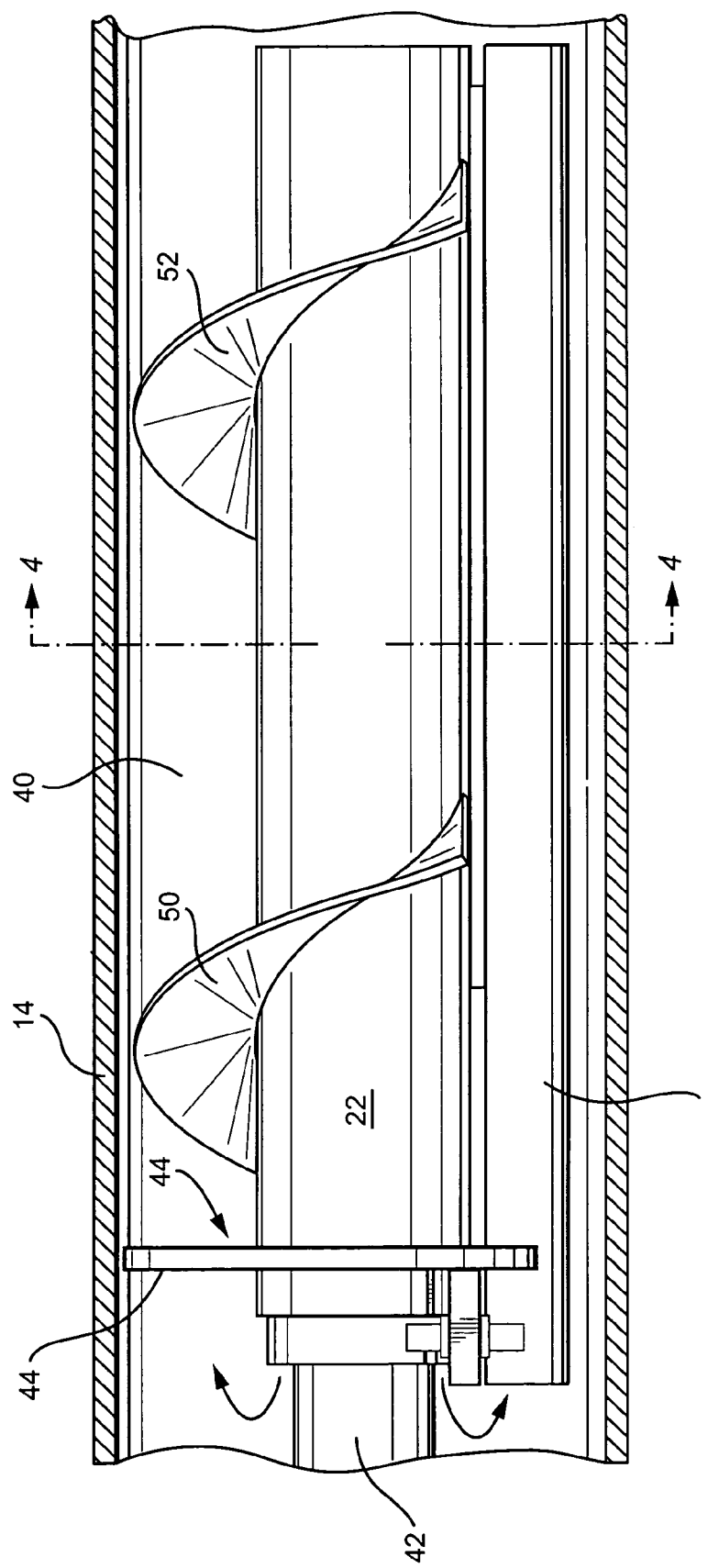
FIG. 3 is a partial side elevation of the inner magnet support bar shown in FIG. 2.

A second structural member promotes good circulation along the entire length of the inner support tube 22. With reference especially to FIG. 3, a plurality of spiral vane segments 50, 52, etc. are attached by welding or other suitable means to the exterior surface of the inner tube 22. The segments are aligned or oriented so as to establish a substantially continuous spiral flow path extending from a location adjacent the baffle 44 to the opposite end of the inner tube 22. The spaces between the segments 50, 52, etc., are aligned along the underside of the inner support tube 22 to provide the space necessary to accommodate the magnet carrier 24. The spiral vane segments 50, 52, etc., extend radially substantially the same distance as the baffle, with only a generous tolerance between the baffle 44 and vane segments 50, 52, etc., and the ID of the target tube 14 to enhance circulation but also to preclude any abrasion of the target tube inner wall. Thus, after passing through the apertures 56, the cooling water is forced to flow along the spiral path established by the vane segments 52.

The spiral vane segments 52 promote good circulation of the cooling water along the entire length of the target tube, and insure continuous flow of cooling water into and out of the region of the plenum below the magnet bar(s). This arrangement also reduces bubble adhesion all along the length of the inner support tube and magnet bar(s).

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A sputtering target comprising an outer target tube, an inner support tube supporting a magnet carrier along substantially the entire length of the inner support tube; and a water cooling circuit including at least one passageway within said inner support tube with an inlet at one end thereof adapted to receive cooling water from an external source, at least one outlet aperture at an opposite end thereof opening to a cooling chamber radially between said inner support tube and said outer target tube; and a plurality of spiral vane segments attached to an outer surface of said inner support tube.

2. The sputtering target of claim 1 wherein said plurality of spiral vane segments axially are spaced along said inner support tube.

3. The sputtering target of claim 2 wherein said spiral segments are arranged and oriented to create a substantially uniform spiral flow path along the length of the inner support bar, wherein axial spaces between said segments are aligned to form a continuous space along the underside of said inner support tube to accommodate said magnet carrier.

4. The sputtering target of claim 1 wherein said spiral flow vane segments extend radially substantially to an inner wall of said outer target tube.

5. The sputtering target of claim 1 wherein said at least one outlet aperture comprises a plurality of jet orifices.

6. The sputtering target of claim 2 wherein said plurality of spiral vane segments are welded to said inner support tube.

7. The sputtering target of claim 1 wherein said spiral vane segments project radially substantially to an inner wall of said outer target tube.

8. A sputtering target comprising an outer target tube, an inner support tube supporting magnet bar carrier extending along substantially the entire length of the inner support tube; and a water cooling circuit including at least one passageway within said inner support tube with an inlet at one end thereof adapted to receive cooling water from an external source, at least one outlet aperture at an opposite end thereof opening to a cooling plenum radially between said inner support tube and said outer target tube; and a plurality of spiral vane segments attached to an outer surface of said inner support tube; wherein said spiral vane segments are arranged to create a substantially uniform spiral flow path along the length of the inner support bar, and wherein axial spaces between said segments are arranged to accommodate said magnet bar carrier.

9. The sputtering target of claim 8 wherein said magnet carrier is secured to an underside of said inner support tube.

10. A sputtering target comprising an outer target tube, an inner support tube supporting a magnet carrier extending along substantially the entire length of the inner support tube; and a water cooling circuit including at least one passageway within said inner support tube with an inlet at one end thereof adapted to receive cooling water from an external source, at least one outlet aperture at an opposite end thereof opening to a cooling chamber radially between said inner support tube and said outer target tube; a baffle comprising a substantially flat plate attached to said inner support tube adjacent said opposite end, said plate extending radially within said plenum between said inner support tube and said outer target tube and having an array of flow apertures therein; and a spiral flow enhancement vane attached to an outer surface of said inner support tube.

11. The sputtering target of claim 10 wherein said baffle is substantially circular in shape, with a cut-out portion therein for accommodating said at least one magnet carrier.

12. The sputtering target of claim 10 wherein said baffle is formed with a solid, non-apertured band portion adjacent said inner support bar.

13. The sputtering target of claim 12 wherein said solid, non-apertured band portion extends from one side of said cut-out to an opposite side of said cut-out.

14. The sputtering target of claim 10 wherein said inner support tube is concentric with a longitudinal axis of said outer target tube and wherein an outer peripheral edge of said baffle is spaced substantially uniformly from said outer target tube except in said cut-out portion.

15. The sputtering target of claim 10 wherein said at least one outlet aperture comprises plural jets, some of which are arranged to emit water in streams parallel to a longitudinal axis of said target tube, and others of which are arranged to emit water in streams at an acute angle to said longitudinal axis.

16. The sputtering target of claim 10 wherein said array of flow apertures extends circumferentially about 270° around said inner support tube.

17. The sputtering target of claim 11 wherein said array of flow apertures extends circumferentially about 270° around said inner support tube.

18. The sputtering claim of claim 10 wherein said inner support tube is cylindrical in shape.

* * * * *